(12) United States Patent
Huang et al.

(10) Patent No.: US 7,404,099 B2
(45) Date of Patent: Jul. 22, 2008

(54) PHASE-LOCKED LOOP HAVING DYNAMICALLY ADJUSTABLE UP/DOWN PULSE WIDTHS

(75) Inventors: Mingwei Huang, Hillsboro, OR (US); Keng L. Wong, Portland, OR (US); Raymond (Hon-Mo) Law, Beaverton, OR (US); Chi-Yeu Chao, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 456 days.

(21) Appl. No.: 10/918,301

(22) Filed: Aug. 13, 2004

(65) Prior Publication Data

US 2006/0034403 A1 Feb. 16, 2006

(51) Int. Cl.
*G06F 1/00* (2006.01)
*G06F 1/12* (2006.01)
*G06F 1/04* (2006.01)

(52) U.S. Cl. .................. 713/500; 713/400; 713/503

(58) Field of Classification Search .............. 713/500, 713/400, 503
See application file for complete search history.

(56) References Cited

U.S. PATENT DOCUMENTS

| | | | |
|---|---|---|---|
| 5,304,954 A * | 4/1994 | Saito et al. ............... | 331/1 A |
| 6,239,632 B1 * | 5/2001 | Moyal et al. ............. | 327/153 |
| 6,320,424 B1 | 11/2001 | Kurd et al. | |
| 6,518,845 B2 * | 2/2003 | Nakamichi ............... | 331/16 |
| 6,614,317 B2 | 9/2003 | Wong et al. | |
| 6,744,838 B1 * | 6/2004 | Dixit ....................... | 375/373 |
| 6,937,075 B2 * | 8/2005 | Lim et al. ................. | 327/157 |
| 7,116,145 B2 * | 10/2006 | Kim et al. ................. | 327/156 |
| 2002/0167365 A1 | 11/2002 | Smith | |
| 2004/0012422 A1 * | 1/2004 | Peng ....................... | 327/156 |
| 2006/0022757 A1 * | 2/2006 | Jung ....................... | 331/1 A |

FOREIGN PATENT DOCUMENTS

WO PCT/US2005/025814    11/2005

* cited by examiner

*Primary Examiner*—Thomas Lee
*Assistant Examiner*—Ji H Bae
(74) *Attorney, Agent, or Firm*—Blakely, Sokoloff, Taylor & Zafman LLP

(57) ABSTRACT

According to embodiments of the present invention, a phase-locked loop (PLL) may include circuitry to select a wide pulse width for the phase-frequency detector control signal when the PLL is in a frequency acquisition stage, a narrow pulse width for the phase-frequency detector control signal when the PLL is in a phase capture stage, and a wide pulse width of the phase-frequency detector control signal when the PLL is in a lock stage.

28 Claims, 7 Drawing Sheets

PHASE-LOCKED LOOP HAVING DYNAMICALLY ADJUSTABLE UP/DOWN PULSE WIDTHS

BACKGROUND

1. Field

Embodiments of the present invention relate to integrated circuit devices and, in particular, to phase-locked loops.

2. Discussion of Related Art

Integrated circuits, such as communication chips, microprocessors, micro-controllers, and/or other devices, often operate at relatively high frequency. The frequency may be in the gigahertz (GHz) range, and future generations of devices may operate even faster.

The devices' operation may be stabilized by a clock source. The clock source may have a phase-locked loop. A phase-locked loop is a circuit or device that compares the phase of two signals, such as for example, a reference signal and a voltage-controlled signal. A phase difference between the two signals produces an error voltage that locks the frequency of the voltage-controlled signal to that of the reference signal. Traditional phase-locked loops have limitations, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
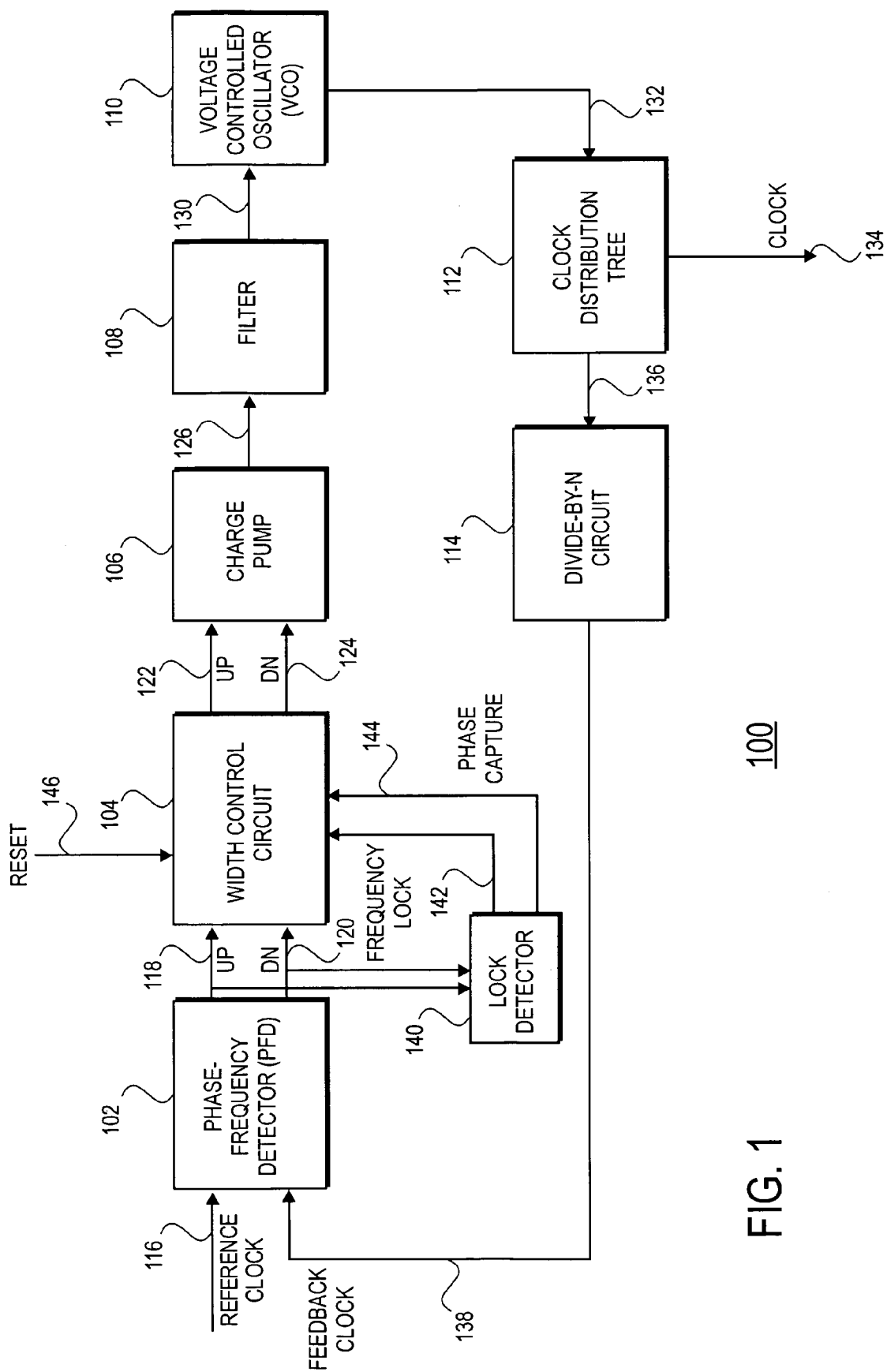
FIG. 1 is a high-level block diagram of a phase-locked loop according to an embodiment of the present invention.

FIG. 1 is a high-level block diagram of a phase-locked loop (PLL) 100 (hereinafter "PLL 100) according to an embodiment of the present invention. In the illustrated embodiment, the PLL 100 includes a phase-frequency detector (PFD) 102 (hereinafter "PFD 102") coupled to a width control circuit 104 via an UP signal 118 and a DN signal 120. A reference clock signal 116 is coupled to an input of the PFD 102.

In the illustrated embodiment, the width control circuit 104 is coupled to a charge pump 106 via an UP signal 122 and a DN signal 124 and the charge pump 106 is coupled to a filter 108 via a control voltage signal 126.

In the illustrated embodiment, the filter 108 is coupled to a voltage-controlled oscillator (VCO) 110 (hereinafter "VCO 110") via a control voltage signal 130 and the VCO 110 is coupled to a clock distribution tree 112 via a clock signal 132. The clock distribution tree 112 outputs a clock signal 134 to other circuitry on an integrated circuit device (for example, to a microprocessor core, a communications chip, a micro-controller) and a clock signal 136.

In the illustrated embodiment, the clock distribution tree 112 is coupled to a divide-by-N circuit 114 via the clock signal 136 and the divide-by-N circuit 114 is coupled to the PFD 102 an input of the PFD 102 via a feedback clock signal 138. In one embodiment, the divide-by-N circuit 114 may alter (for example, lower) the frequency of the clock signal 136 so that the frequency of the feedback clock signal 138 is compatible with the PFD 102.

In the illustrated embodiment, a lock detector 140 is coupled to the UP signal 122 and the DN signal 124. The lock detector 140 also is coupled to inputs of the width control circuit 104, via a frequency lock signal 142 and a phase capture signal 144, for example. A RESET signal 146 may be coupled to the width control circuit 104, to enable and/or disable the PLL 100, for example. In response to the PLL 100 not being enabled, because the RESET signal 146 is asserted, for example, the frequency of the clock signal 132 and/or 134, and/or the feedback clock signal 138 may be the free-running frequency of the VCO 110.

In embodiments of the present invention, in response to the PLL 100 being enabled, because the RESET signal 146 is de-asserted, for example, the PLL 100 may attempt to lock on a target frequency. In attempting to lock on the target frequency, the PLL 100 may have a frequency acquisition stage in which the PLL 100 may ramp up to the target frequency, and, as the PLL 100 approaches the target frequency, a phase capture stage in which the PLL 100 may attempt to resolve a phase error between the reference clock signal 116 and the feedback clock signal 138. After frequency acquisition and phase capture, the PLL 100 may enter a lock stage in which the PLL 100 may be locked on the target frequency (for example, the reference clock signal 116 frequency). The lock detector 140 may output the frequency lock signal 142 to the width control circuit 104 to indicate that the PLL 100 is approaching the target frequency and the phase capture signal 144 to indicate that the PLL 100 has captured phase.

Figure 2:
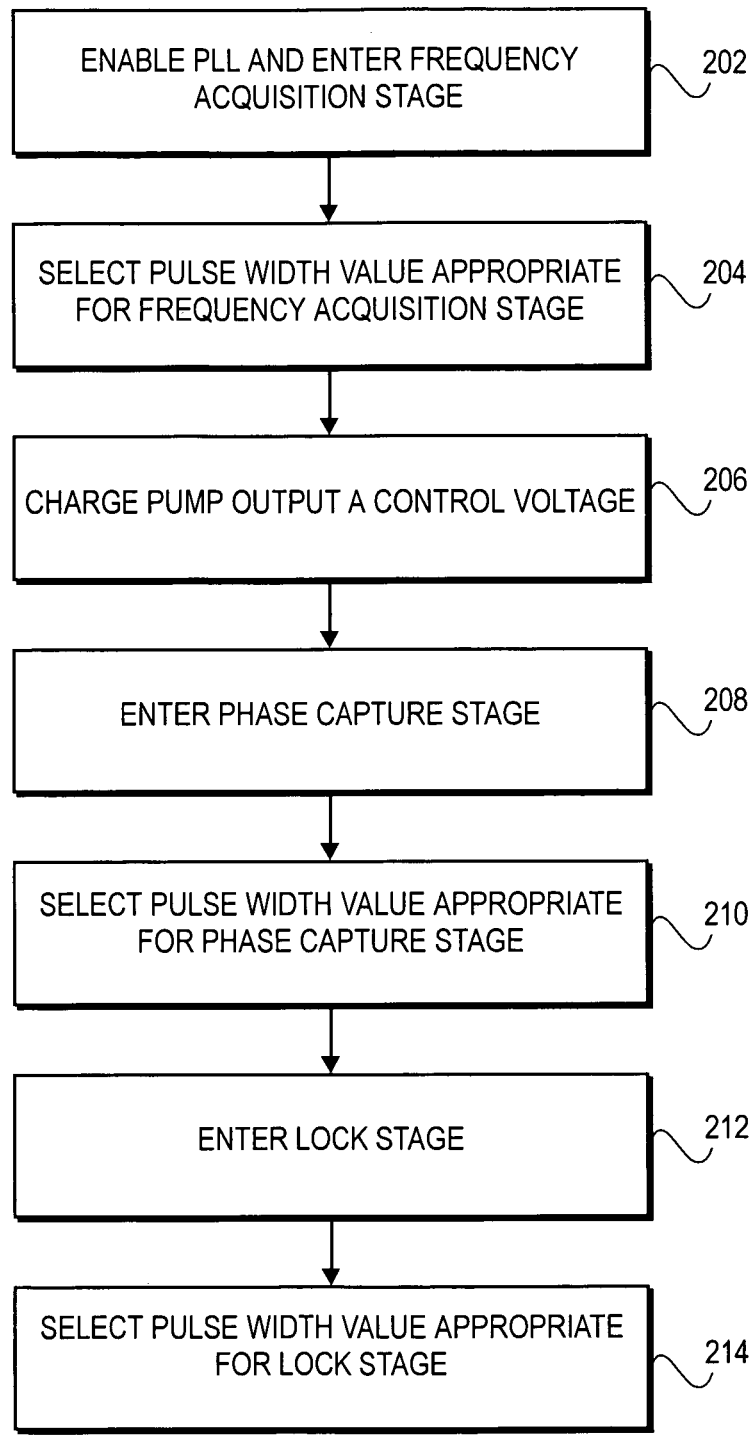
FIG. 2 is a flowchart illustrating an approach to operating a phase-locked loop according to an embodiment of the present invention.

FIG. 2 is a flowchart illustrating a process 200 for operating the PLL 100 according to an embodiment of the present invention. The operations of the process 200 are described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented.

Of course, the process 200 is an example process and other processes may be used to implement embodiments of the present invention. A machine-accessible medium with machine-readable data thereon may be used to cause a machine, for example, a processor to perform the process 200.

In a block 202, the PLL 100 is enabled and may enter the frequency acquisition stage. In one embodiment, the RESET signal 146 may be de-asserted to enable the PLL 100. In one embodiment, the PFD 102 may compare the reference clock signal 116 with the feedback clock signal 138 and may output an UP signal 118 and a DN signal 120 to the width control circuit 104.

In a block 204, the width control circuit 104, in response to the RESET signal 146 being de-asserted, for example, may select a value for the pulse width for the UP signal 118 and the DN signal 120 appropriate for the frequency acquisition stage of the PLL 100. In one embodiment, in response to the UP signal 118 and/or the DN signal 120 having pulse width values that are greater than the value selected by the width control circuit 104, the width control circuit 104 may reduce the pulse width values of the UP signal 118 and/or the DN signal 120 to the selected value and output the UP signal 122 and the DN signal 124 with pulse width values reduced to the selected value for the frequency acquisition stage.

Figure 3:
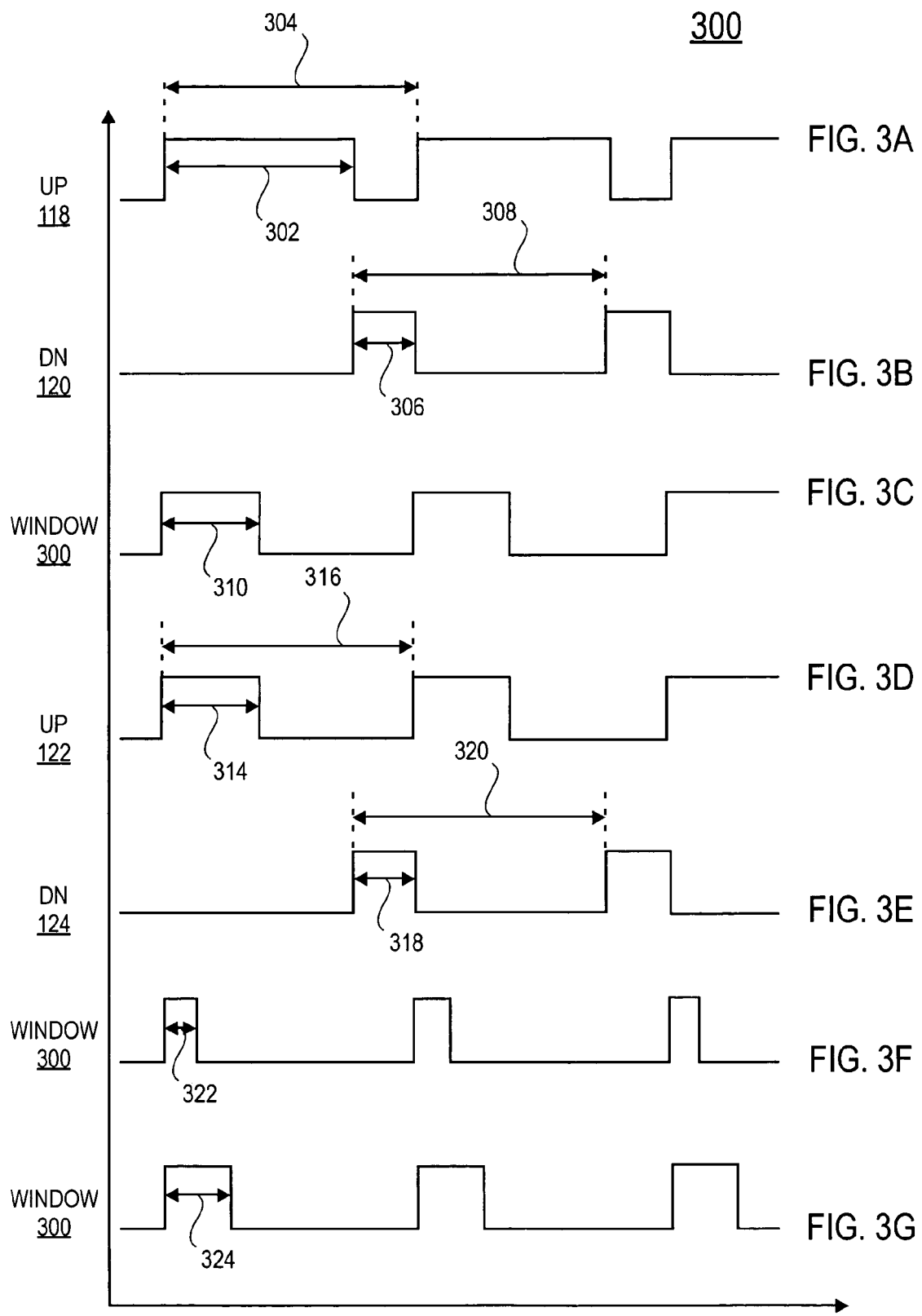
FIG. 3 is a graphical representation of timing diagrams 3A-3G, which illustrate operation of a phase-locked loop according to an embodiment of the present invention.

FIG. 3 is a graphical representation 300 illustrating a relationship among the UP signal 118, the DN signal 120, the UP signal 122, the DN signal 124, and a window 300 representing the selected pulse width value during a frequency acquisition stage, a phase capture stage, and a lock stage of the PLL 100 according to an embodiment of the present invention. The relationship is illustrated using FIG. 3A, which is a timing diagram showing the UP signal 118 with a pulse width value 302 and a duty cycle value 304, FIG. 3B, which is a timing diagram showing the DN signal 120 having a pulse width value 306 and a duty cycle value 308, FIG. 3C, which is a timing diagram showing the window 300 with a pulse width value 310, FIG. 3D, which is a timing diagram showing the UP signal 122 having a pulse width value 314 and a duty cycle value 316, FIG. 3E is a timing diagram showing the DN signal 124 has a pulse width value 318 and a duty cycle value 320, FIG. 3F, which is a timing diagram showing the window 300 having a pulse width value 322, and FIG. 3G is a timing diagram showing the window 300 having a pulse width value 324.

According to embodiments of the present invention, the pulse width values of the window 300 may be dynamically changed, for example, on-the-fly from pulse width value 310, to pulse width value 322, to pulse width value 324, during and after the PLL 100 is locking on a target frequency. In one embodiment, the pulse width value 310 may be dynamically selected for use during the frequency acquisition stage of the PLL 100, the pulse width value 322 may be selected for use during the phase capture stage, and the pulse width value 324 may be selected for use during the lock stage.

The UP signal 118 and the DN signal 120 pass through the window 300. In the illustrated embodiment, because the pulse width value 302 of the UP signal 118 is greater than the selected pulse width value 310, the UP signal 118 may be truncated and the width control circuit 104 outputs the UP signal 122 with the pulse width value 314, which is substantially equivalent to the selected pulse width value 310. In the illustrated embodiment, because the pulse width value 306 of the DN signal 120 in the illustrated embodiment is not greater than the selected pulse width value 310, the DN signal 120 is not truncated and the width control circuit 104 outputs the DN signal 124 with the original pulse width value 306.

The UP signal 118 has duty cycle value 304 and the DN signal 120 has a duty cycle value 308. The difference in the duty cycles 304 and 308 correspond to phase and frequency differences between the reference clock signal 116 and the feedback clock signal 138. The UP signal 122 has duty cycle value 316, which is different from the duty cycle value 304. The DN signal 124 also has a duty cycle value 320. The difference in the duty cycles 316 and 320 correspond to phase and frequency differences between the reference clock signal 116 and the feedback clock signal 138 as adjusted by the pulse width value 310.

Referring back to FIG. 2, in a block 206, in response to the difference in the duty cycles 316 and 320, the charge pump 106 may output the control voltage signal 126 as an error voltage corresponding to the difference in the duty cycles 316 and 320. The filter 108 may integrate the control voltage signal 126 and the control voltage signal 130 may attempt to force the frequency of the clock signal 132 output by the VCO 110 to vary in a direction that reduces the frequency and phase difference between the reference clock signal 116 and the feedback clock signal 138 in an effort to reach and lock on to the target frequency.

In one embodiment, in response to the control voltage signal 130, the frequency of the clock signal 132 may ramp up towards the target frequency. In the illustrated embodiment, the pulse width value 310 may be chosen to cause a relatively large difference between the duty cycle 316 and the duty cycle 320 so that the frequency of the clock signal 132 may ramp up to the target frequency relatively quickly during the frequency acquisition stage.

In a block 208, the PLL 100 may enter the phase capture stage. In one embodiment, the lock detector 140 may assert a frequency lock signal 142 to the width control circuit 104 to indicate that the clock signal 132 frequency has substantially ramped up to the target frequency and is entering the phase capture stage.

In a block 210, the width control circuit 104 may dynamically select a new pulse width value appropriate for the phase capture stage of the PLL 100. In one embodiment, the width control circuit 104 selects the pulse width value 322 and the UP signal 122 and the DN signal 124 as a result may have pulse width values and duty cycles adjusted by the pulse width value 322. In this and other embodiments, the control voltage signal 130 may cause the frequency of the clock signal 132 to substantially stop ramping up towards the target frequency so quickly to reduce any overshoot and/or undershoot of the target frequency caused by the quick ramp up using the pulse width value 310, for example.

In a block 212, the PLL 100 may enter the lock stage. In one embodiment, the lock detector 140 may assert the phase capture signal 142 to the width control circuit 104 to indicate that the frequency of the clock signal 132 is substantially the target frequency and that the difference in the phase between the reference clock signal 116 and the feedback clock signal 138 is appropriate for the lock stage.

In a block 214, the width control circuit 104 may dynamically select a new pulse width value appropriate for the lock stage of the PLL 100. In one embodiment, the width control circuit 104 selects the pulse width value 324 and the UP signal 122 and the DN signal 124 as a result may have pulse width values and duty cycles adjusted by the pulse width value 324. In this and other embodiments, the control voltage signal 130 may cause the frequency of the clock signal 132 to remain substantially locked on the target frequency. In one embodiment, the pulse width value 324 may cause the charge pump 106 to output a larger control voltage 126 to the VCO 110 during the lock stage, to reduce the risk of VCO 110 overvoltage when the PLL 100 is responding to a perturbation (for example, noise) after lock.

Figure 4:
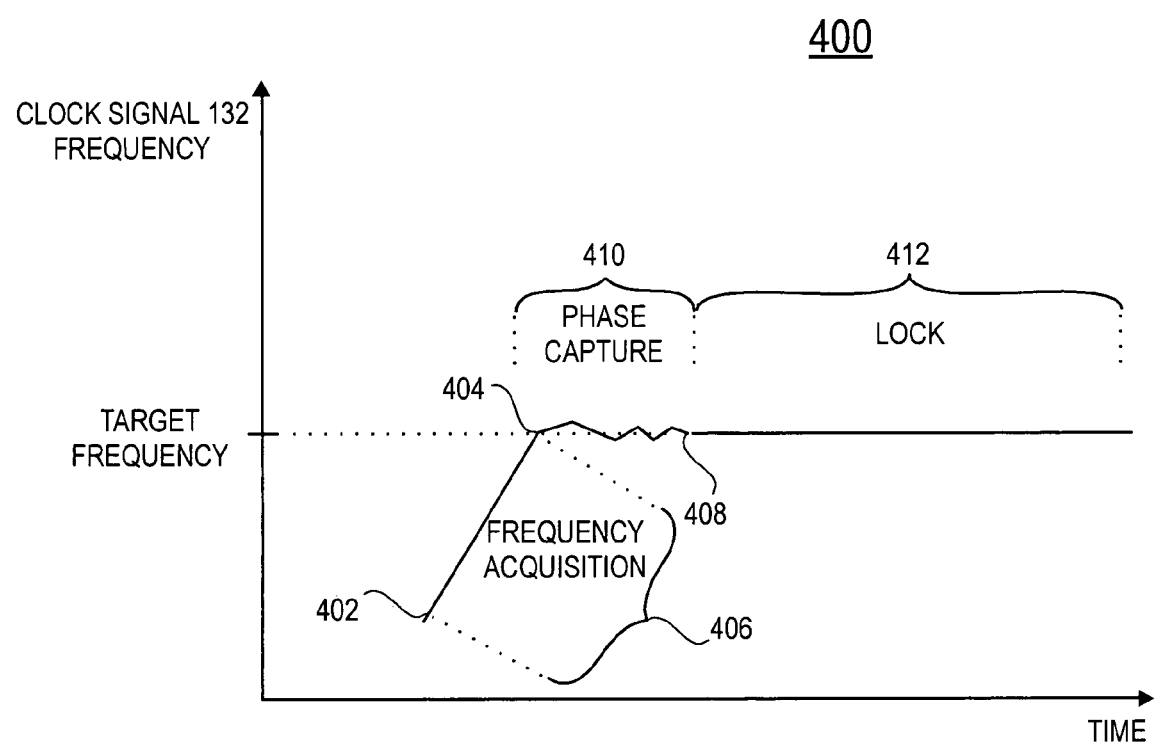
FIG. 4 is a graphical representation of the operation of a phase-locked loop according to an embodiment of the present invention.

FIG. 4 is a graphical representation 400 illustrating a behavior of the clock signal 132 according to an embodiment of the present invention. In the illustrated embodiment, the graphical representation 400 includes a frequency acquisition area 406 bounded by a point 402 and a point 404, a phase capture area 410 bounded by the point 404 and a point 408, and a lock area 412, which begins with the point 408.

The example graphical representation 400 illustrates that in one embodiment, during the frequency acquisition stage the frequency of the clock signal 132 ramps up relatively quickly to the target frequency until the PLL 100 enters the phase capture stage. The example graphical representation 400 also illustrates that during the phase capture stage the frequency of the clock signal 132 overshoots and undershoots the target frequency until the PLL 100 enters the lock stage, but that the amount of overshoot and undershoot is inconsistent with the rate at which the frequency of the clock signal 132 ramped up. This may be in response to the pulse width value 322 being narrower than the pulse width value 310 and thus the charge pump 106 driving the VCO 110 less hard in the phase capture stage.

The example graphical representation 400 also illustrates that during the lock stage the frequency of the clock signal 132 remains substantially at the target frequency. In embodiments of the present invention, the frequency of the clock signal 132 remains substantially at the target frequency until the RESET signal 146 is asserted or the PLL 100 loses lock, due to noise, for example.

Figure 5:
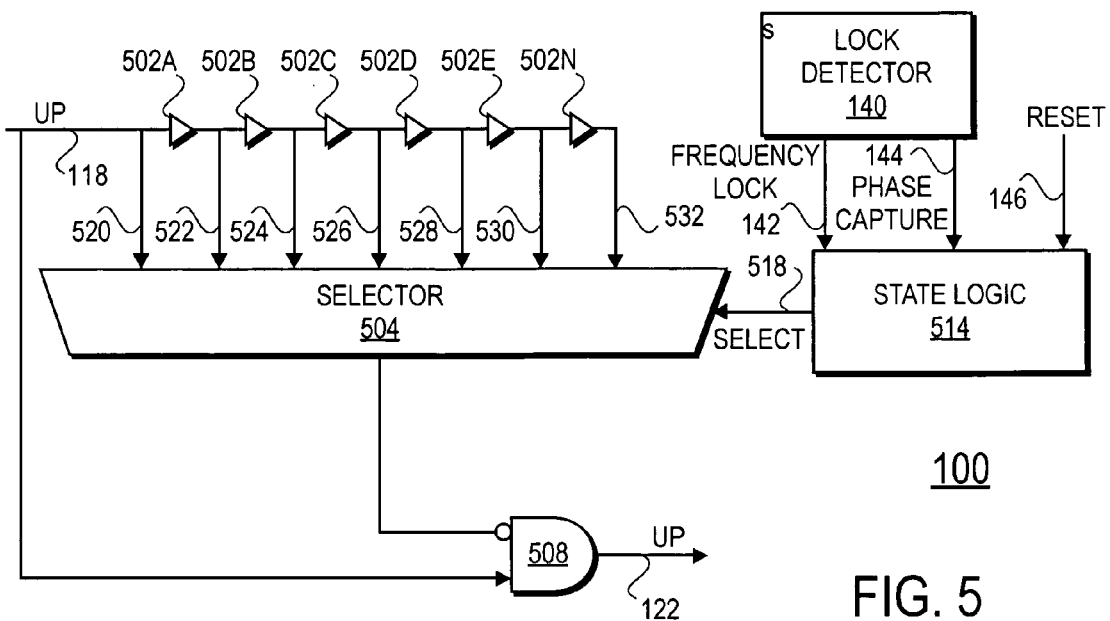
FIG. 5 is a schematic diagram of phase-locked loop circuitry according to an embodiment of the present invention.

FIG. 5 is a schematic diagram illustrating the width control circuit 104 in more detail according to an embodiment of the present invention. In the illustrated embodiment, the UP signal 118 is coupled to a delay bank comprised of several inverters 502. The outputs of the inverters 502 may be coupled to a selector 504, whose output may be coupled to an inverted input of an AND gate 508. The UP signal 118 also may be coupled to a non-inverted input of the AND gate 508. The frequency lock signal 142 and the phase capture signal 144 may be coupled to state logic 514 from the lock detector 140. The RESET signal 146 also may be coupled to state logic 514. The state logic 514 may select a particular inverter 502 output using a select signal 518.

Selecting a particular inverter 502 output introduces the delay of the previous inverters 502. The delay may cause the pulse width of the UP signal 122 to change.

For example, when the RESET signal 146, frequency lock signal 142, and phase capture signal 144 are de-asserted, the state logic 514 may cause the select signal 518 to select a tap 524 or even a tap 526 for the UP signal 122 for the frequency acquisition stage. When the RESET signal 146 and the phase capture signal 144 are de-asserted, but the frequency lock signal 142 is asserted, the state logic 514 may cause the select signal 518 to select a tap 530 or even 532 for the UP signal 122 for the phase capture stage. When the RESET signal 146 is de-asserted, but the frequency lock signal 142 and the phase capture signal 144 are asserted, the state logic 514 may cause the select signal 518 to select a tap 524, a tap 526, or even a tap 528 for the UP signal 122 for the lock stage.

Figure 6:
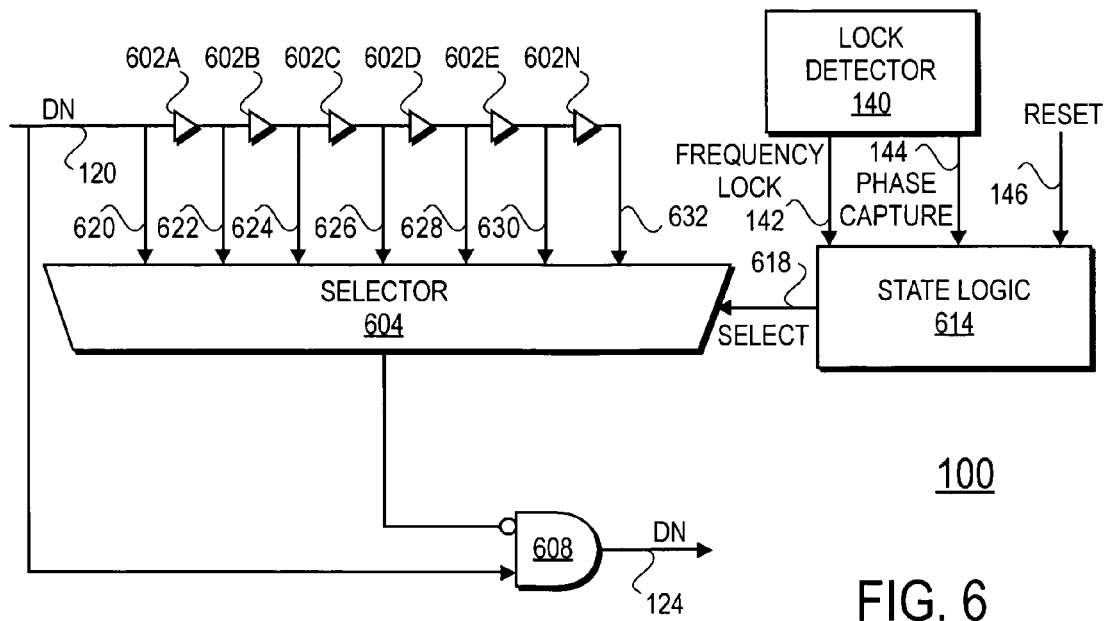
FIG. 6 is a schematic diagram of a phase-locked loop circuitry according to an alternative embodiment of the present invention.

FIG. 6 is a schematic diagram illustrating the width control circuit 104 in more detail according to an embodiment of the present invention. In the illustrated embodiment, the DN signal 120 is coupled to a delay bank comprised of several inverters 602. The outputs of the inverters 602 may be coupled to a selector 604, whose output may be coupled to an inverted input of an AND gate 608. The DN signal 120 also may be coupled to a non-inverted input of the AND gate 608. The frequency lock signal 142 and the phase capture signal 144 may be coupled to state logic 614 from the lock detector 140. The RESET signal 146 also may be coupled to state logic 614. The state logic 614 may select a particular inverter 602 output using a select signal 618. In embodiments of the present invention, the width control circuit 104 portion illustrated in FIG. 6 operate to generate the DN signal 124 in a manner that is substantially the same as the width control circuit 104 portion illustrated in FIG. 5 operates to generate the UP signal 122.

In an alternative embodiment, the width control circuit 104 may be self-biased. For example, the inverters 502 and/or 602 may be self-biased inverters.

Figure 7:
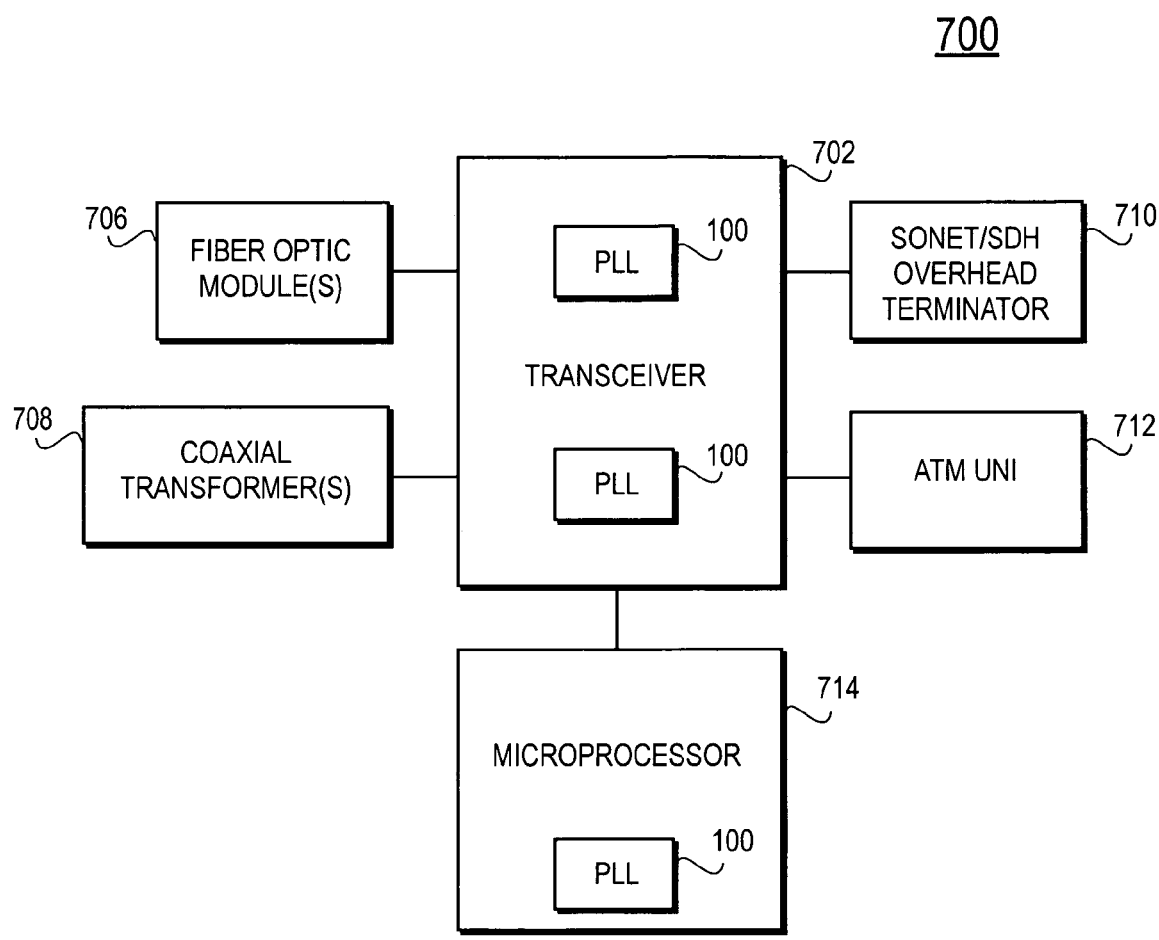
FIG. 7 is a high-level block diagram of a communication system according to an embodiment of the present invention.

FIG. 7 is a high-level block diagram of a communication system 700 implementing the PLL 100 according to an embodiment of the present invention. In the illustrated embodiment, the system 700 includes a transceiver 702, which may be a front-end transceiver suitable for Asynchronous Transfer Mode (ATM) transmission applications. The example transceiver includes a pair of PLLs 100, at least one of which is implemented according to embodiments of the present invention.

The example transceiver 702 interfaces to one ore more fiber optic modules 706 and/or coaxial transformers 708 on the line side, and to a Synchronous Optical Network/Synchronous Digital Hierarchy (SONET/SDH) overhead terminator 710 and/or ATM User Network Interface (UNI) on the system side.

The transceiver 702 also may interface to a microprocessor 714. The microprocessor 714 also may include a PLL 100. In this embodiment, the clock signal 134 may be the core clock for the microprocessor 714.

Figure 8:
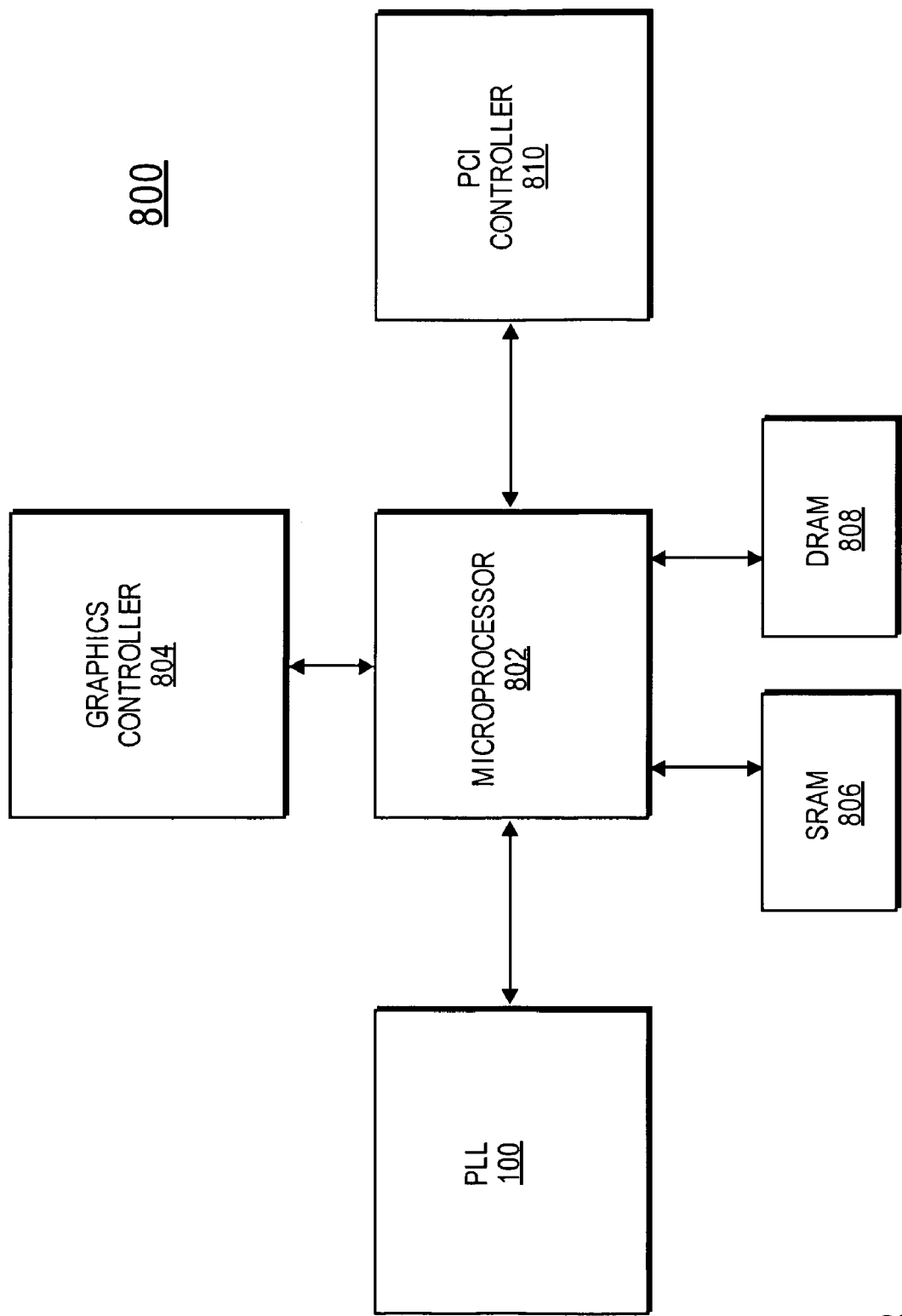
FIG. 8 is a high-level block diagram of a computer system according to an embodiment of the present invention.

Of course, in embodiments of the present invention, the PLL 100 may be implemented in other integrated circuits, such as micro-controllers, for example, and/or stand-alone microprocessors. For example, FIG. 8 is a high-level block diagram of a computer system 800 according to an embodiment of the present invention. In the illustrated embodiment, the computer system 800 includes a microprocessor 802 coupled to a graphics controller 804, a static random access memory (SRAM) 806, a dynamic random access memory (DRAM) 808, a peripheral component interconnect (PCI) controller 810, and the PLL 100.

The system 800 may be a high-performance desktop, a workstation, a server, etc. In one embodiment the system 800 is a UNIX platform. In other embodiments, the system 800 may be Windows® or Windows® NT platform.

The microprocessor 802 may be any suitable microprocessor that performs conventional functions of executing programming instructions including implementing many embodiments of the present invention. The microprocessor 802 can be a processor of the Pentium® processor family available from Intel Corporation of Santa Clara, Calif., but might be any suitable processor.

The graphics controller 804 may be any suitable graphics controller that receives commands and data and generates display signals (e.g., in RGB format).

The illustrated SRAM 806 and/or DRAM 808 may be any suitable memory that store data (pixels, frames, audio, video, etc.) and software (control logic, instructions, code, computer programs, etc.) for access by other system 800 components. In one embodiment, the microprocessor 802 also may be coupled to flash memory (not shown).

The PCI controller 810 may be any suitable PCI controller that interfaces memory to a PCI bus hierarchy. Suitable PCI controllers include PCI-X controllers and PCI-Xpress controllers.

Embodiments of the present invention may be implemented using hardware, software, or a combination thereof. In implementations using software, the software may be stored on a machine-accessible medium.

A machine-accessible medium includes any mechanism that may be adapted to store and/or transmit information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), as recess as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, recess-known structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
   state logic to receive a signal to indicate that a phase-locked loop is enabled,
   the state logic to select a first value for a pulse width of at least one phase-frequency detector control signal based on the signal to indicate that the phase-locked loop is enabled, the state logic to select the first value for the pulse width of the phase-frequency detector control signal based on a phase difference between at least a first cycle of a reference clock and a feedback clock,
   the state logic to receive a frequency lock signal to indicate that the phase-locked loop has acquired frequency lock, the state logic to select a second value for the pulse width based on the frequency lock signal, and
   the state logic to receive a phase capture signal to indicate that the phase-locked loop has captured phase, the state logic to select a third value for the pulse width based on the phase capture signal.

2. The apparatus of claim 1, wherein the pulse width based on the signal to indicate that a phase-locked loop is enabled is wider than the pulse width based on the frequency lock signal.

3. The apparatus of claim 2, wherein the pulse width based on the frequency lock signal is narrower than the pulse width based on the phase capture signal.

4. The apparatus of claim 1, further comprising a phase-frequency detector to generate the phase-frequency detector control signal.

5. The apparatus of claim 1, further comprising a lock detector to generate the frequency lock signal and the phase capture signal.

6. The apparatus of claim 1, further comprising a selector to select a first delay corresponding to the first value for the pulse width, a second delay corresponding to the second value for the pulse width, a third delay corresponding to the third value for the signal pulse width based on a select signal value output from the state logic.

7. The apparatus of claim 1, further comprising a charge pump to generate a control voltage using the phase-frequency detector control signal having a pulse width of the first value, the second value, and the third value.

8. The apparatus of claim 7, further comprising a filter to filter the control voltage.

9. The apparatus of claim 8, further comprising a voltage-controlled oscillator to use the control voltage to generate a clock signal having a frequency substantially equal to a target frequency of the phase-locked loop, the voltage-controlled oscillator to generate the clock signal having the frequency substantially equal to the target frequency after the phase-locked loop has acquired frequency lock and phase capture.

10. The apparatus of claim 8, further comprising a voltage-controlled oscillator to use the control voltage to generate a clock signal having a frequency ramping up to a target frequency of the phase-locked loop, the voltage-controlled oscillator to generate the clock signal ramping up to the target frequency when the phase-locked loop is acquiring frequency lock.

11. The apparatus of claim 8, further comprising a voltage-controlled oscillator to use the control voltage to generate a clock signal having a frequency overshooting and undershooting a target frequency of the phase-locked loop, the voltage-controlled oscillator to generate the clock signal having a frequency overshooting and undershooting the target frequency when the phase-locked loop is acquiring phase capture.

12. A method, comprising:
    selecting a first value for a pulse width for at least one phase-frequency detector control signal in response to an indication that a phase-locked loop is attempting to acquire a target frequency, wherein selecting the first value for the pulse width of the phase-frequency detector control signal is based on a phase difference between at least a first cycle of a reference clock and a feedback clock;
    adjusting the pulse width to a second value in response to an indication that the phase-locked loop has acquired the target frequency and is attempting to capture phase; and
    adjusting the pulse width to a third value in response to an indication that the phase-locked loop is locked on the target frequency.

13. The method of claim 12, wherein the first value for the pulse width is wider than the second pulse width.

14. The method of claim 13, further comprising selecting a first delay and a second delay, the first delay and the second delay to determine the first pulse width and the second pulse width, respectively.

15. The method of claim 13, wherein the third value for the pulse width is different from the first value for the pulse width.

16. An article of manufacture, comprising:
    a recordable machine-accessible medium having data that, when accessed by a machine, cause the machine to perform the operations comprising:
        ramping up to a target frequency for a phase-locked loop using a first UP signal/DN signal pulse width, wherein the first UP signal/DN signal pulse width is based on a phase difference between at least a first cycle of a reference clock and a Redhack clock;
        overshooting and undershooting the target frequency for the phase-locked loop using a second UP signal and DN signal pulse width different from the first UP signal/DN signal pulse width; and operating at substantially the target frequency at a third UP signal/DN signal pulse width.

17. The article of manufacture of claim 16, wherein the machine-accessible medium further includes data that cause the machine to perform operations comprising ramping up to the target frequency during frequency lock acquisition.

18. The article of manufacture of claim 17, wherein the machine-accessible medium further includes data that cause the machine to perform operations comprising overshooting and undershooting the target frequency target frequency during phase capture.

19. The article of manufacture of claim 18, wherein the machine-accessible medium further includes data that cause the machine to perform operations comprising operating at substantially the target frequency after frequency lock and phase capture.

20. An apparatus, comprising:
a phase-locked loop having:
a detector to generate at least one control signal indicating a phase difference and a frequency difference between at least a first cycle of a reference clock signal and a feedback clock signal, the control signal having a duty cycle; and
duty cycle control circuitry to generate a first value for the duty cycle during frequency acquisition of the phase-locked loop, to adjust the duty cycle to a second value after frequency acquisition and during phase capture of the phase-locked loop, and to adjust the duty cycle to a third value after frequency and phase capture of the phase-locked loop, the phase-locked loop to generate a clock signal at a target frequency after frequency lock and phase capture of the phase-locked loop.

21. The apparatus of claim 20, further comprising a voltage-controlled oscillator to output a first clock signal in response to the first value for the duty cycle the first clock signal to ramp up to the target frequency.

22. The apparatus of claim 21, the voltage-controlled oscillator to output a second clock signal in response to the second value for the duty cycle, the second clock signal to overshoot and undershoot the target frequency.

23. The apparatus of claim 22, the voltage-controlled oscillator to output a third clock signal in response to the third value for the duty cycle, the third clock signal being substantially the target frequency.

24. A method, comprising:
selecting a first pulse width for at least one phase-frequency detector control signal based on receiving an indication that a phase-locked loop is attempting to acquire a target frequency, where the first pulse width is based on a phase difference between at least a first cycle of a reference clock and a feedback clock; and
adjusting to a second pulse width that is more narrow than the first pulse width based on receiving an indication that the phase-locked loop has acquired the target frequency, and is subsequently attempting to capture phase.

25. The method of claim 24, further comprising generating a clock signal at a target frequency after the phase-locked loop has acquired the target frequency.

26. A system, comprising:
a microprocessor;
a phase-locked loop coupled to the microprocessor, the phase-locked loop to generate at least one control signal indicating a phase difference and a frequency difference between at least a first cycle of a reference clock and a feedback clock, the control signal having a duty cycle to be set to a first value during frequency acquisition of the phase-locked loop and to a second value during phase capture of the phase-locked loop; and
peripheral component interconnect (PCI) controller coupled to the microprocessor.

27. The system of claim 26, wherein the phase-locked loop is further to set the duty cycle of the control signal to a third value after the phase-locked loop has acquired frequency lock and phase capture.

28. The system of claim 27, wherein the phase-locked loop is further to generate a clock signal at a target frequency after the phase-locked loop has acquired frequency lock and phase capture.

* * * * *